United States Patent
Takabayashi et al.

(12)

(10) Patent No.: US 6,377,083 B1
(45) Date of Patent: Apr. 23, 2002

(54) SEMICONDUCTOR INTEGRATED DEVICE AND METHODS OF DETECTING AND CORRECTING A VOLTAGE DROP IN AN INTEGRATED CIRCUIT

(76) Inventors: Tsutomu Takabayashi; Kenji Kawano; Shizuo Morizane, all of c/o Mitsubishi Denki Kabushiki Kaisha 2-3,Marunouchi 2-chome, Chiyoda-ku, Tokyo 100-8310 (JP)

( * ) Notice: Subject to any disclaimer, the term of this patent is extended or adjusted under 35 U.S.C. 154(b) by 0 days.

(21) Appl. No.: 09/686,062

(22) Filed: Oct. 11, 2000

(30) Foreign Application Priority Data

May 25, 2000 (JP) ......................................... 2000-155300

(51) Int. Cl.[7] .............................. H03D 1/00; H03K 5/22; H03K 5/153; H03K 5/159
(52) U.S. Cl. ........................... 327/50; 327/143; 327/198
(58) Field of Search ................................ 327/565, 545, 327/540, 541, 566, 50, 202, 203, 219, 215, 218, 143, 198; 361/601

(56) References Cited

U.S. PATENT DOCUMENTS 4,104,860 A * 8/1978 Stickel ........................ 327/203
5,367,202 A * 11/1994 Yee ............................. 327/540
5,672,997 A * 9/1997 Shield ......................... 327/540
5,812,021 A * 9/1998 Ikeda .......................... 327/540
5,847,587 A * 12/1998 Chen et al. .................. 327/143
6,271,718 B1 * 8/2001 Sohn et al. .................. 327/540

FOREIGN PATENT DOCUMENTS

| JP | 1-276660 | 11/1989 |
| JP | 7-56885 | 3/1995 |
| JP | 7-325633 | 12/1995 |

* cited by examiner

Primary Examiner—Terry D. Cunningham
Assistant Examiner—Long Nguyen

(57) ABSTRACT

A semiconductor integrated device has a detection cell arranged in a power-supply line in the semiconductor integrated device and detecting a power-supply voltage. Further, a detection circuit detects a voltage drop of the power-supply voltage detected by the detection cell. Connection wiring connects the detection cell and the detection circuit and outputs the power-supply voltage detected by the detection cell to the detection circuit.

7 Claims, 5 Drawing Sheets

FIG.5
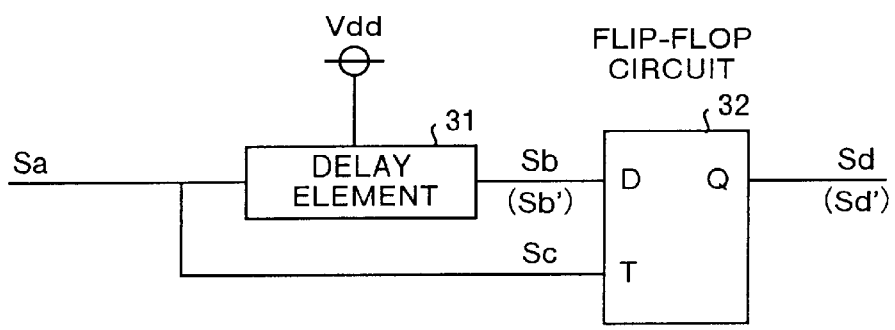
FIG.6
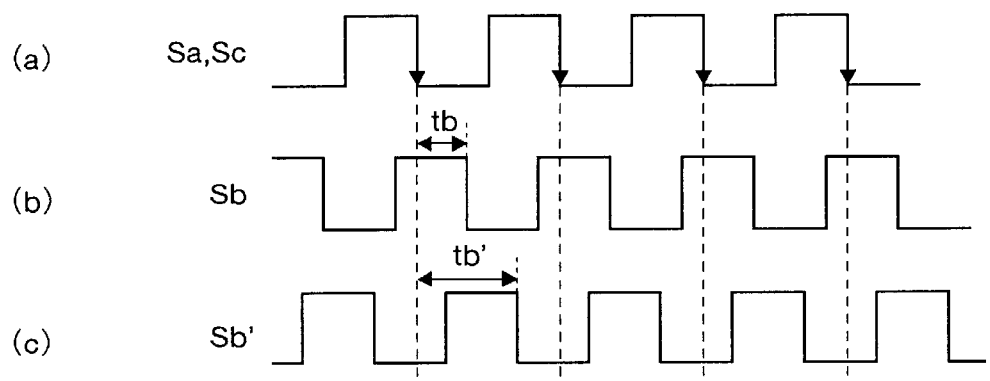
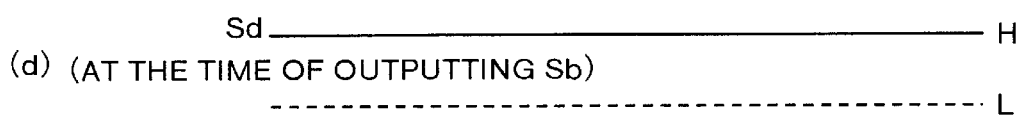
(d) (AT THE TIME OF OUTPUTTING Sb)
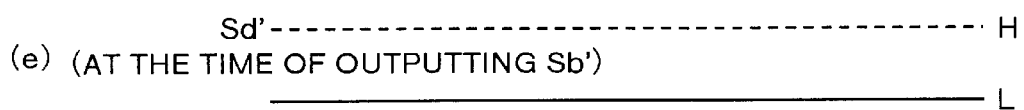
(e) (AT THE TIME OF OUTPUTTING Sb')

SEMICONDUCTOR INTEGRATED DEVICE AND METHODS OF DETECTING AND CORRECTING A VOLTAGE DROP IN AN INTEGRATED CIRCUIT

FIELD OF THE INVENTION

The present invention relates to a semiconductor integrated device which enables low-voltage driving, high speed and high integration in a semiconductor integrated circuit. This invention relates also to a method of detecting a voltage drop of the integrated circuit and a method of correcting the voltage drop.

BACKGROUND OF THE INVENTION

As computerization has been improved in recent years, the integration degree of integrated circuits has been heightened every year. Meanwhile, a driving voltage of the integrated circuit is being lowered to 2.5 V or 1.8 V in order to cope with energy conservation and mobilization.

As the density of the integrated circuit is heightened, power-supply wiring on the integrated circuit has become narrower. This is disadvantageous for supplying a power source due to an increase of resistance. Meanwhile, power consumption increases due to a high-speed operation, and a lot of transistors are actuated. As a result, a voltage drop easily occurs when an electrical current is supplied to the integrated circuit.

As a general technique which copes with the voltage drop, there exists a microcomputer disclosed in Japanese Patent Application Laid-Open No. 7-56885. When the power-supply voltage drops or the frequency of a system clock becomes high reaching an operational limit, this microcomputer detects this state and changes a sense amplification circuit having a plurality of circuit constants secure a suitable operational range according to the power-supply voltage or changes the frequency of the system clock.

When the voltage drop becomes greater in the integrated circuit, the transistors in the integrated circuit cannot operate normally, and normal operation of the whole integrated circuit cannot be ensured. Particularly, this phenomenon that the normal operation cannot be ensured easily occurs in low-voltage driving, and seriously interfering with low-voltage driving, high speed and high integration of the integrated circuit.

SUMMARY OF THE INVENTION

It is an object of the invention to provide a semiconductor integrated device detecting a voltage drop of a power-supply voltage in an integrated circuit and correcting the voltage drop and to provide a method of detecting a voltage drop of an integrated circuit and a method of correcting a voltage drop.

According to a semiconductor integrated device of one aspect of the present invention, the voltage detection cell is arranged in the predetermined position on the power-supply wiring in the semiconductor integrated circuit and detects a power-supply voltage in the predetermined position. The power-supply voltage is output to the voltage drop detection circuit via the connection wiring, and the voltage drop detection circuit detects a voltage drop of the power-supply voltage detected by the voltage detection cell.

Further, the voltage drop detection circuit is composed of the comparator and compares the power-supply voltage detected by the voltage detection cell with a reference voltage. A judgment is made based on the compared result as to whether or not a voltage drop occurs.

Further, the delay element in the voltage drop detection circuit delays and output a predetermined input signal according to a voltage drop of the power-supply voltage detected by the voltage detection cell. The flip-flop circuit judges as to whether or not a voltage drop amount is not less than a predetermined value based on the predetermined input signal and the signal delayed and output by the delay element and outputs the judged result.

Further, the voltage drop correction circuit corrects the voltage drop of the power-supply voltage based on the voltage drop which is detected by the voltage drop detection circuit.

Further, the voltage drop correction circuit is a frequency control circuit. The frequency control circuit changes a clock frequency of the power-supply voltage based on the voltage drop detected by the voltage drop detection circuit, and corrects the voltage drop.

Further, the voltage drop correction circuit is a voltage control circuit. The voltage control circuit changes a voltage of the power-supply voltage based on the voltage drop detected by the voltage drop detection circuit, and corrects the voltage drop.

According to the method of detecting a voltage drop in an integrated circuit of another aspect of this invention, the cell arrangement determination step determines a predetermined position of the voltage detection cell which is arranged in the predetermined position on the power-supply wiring in the semiconductor integrated circuit and detects a power-supply voltage in the predetermined position. The wiring position determination step determines a wiring position of the connection wiring for connecting the voltage detection cell and the voltage drop detection circuit for detecting the voltage drop of the power-supply voltage detected by the voltage detection cell. The integrated circuit producing step produces the integrated circuit including the voltage detection cell and the connection wiring. The voltage drop detection step detects the voltage drop of the power-supply voltage detected by the voltage detection cell using the voltage drop detection circuit.

Further, the voltage drop detection step compares the voltage detected by the voltage detection cell with a reference voltage and detects the voltage drop of the power-supply voltage based on the compared result.

Further, the voltage drop detection step detects a voltage drop of the power-supply voltage based on the delay amount according to the voltage detected by the voltage detection cell.

According to method of correcting a voltage drop in an integrated circuit of still another aspect of the present invention, the cell arrangement determination step determines a predetermined position of the voltage detection cell which is arranged in the predetermined position on the power-supply wiring in the semiconductor integrated circuit and detects the power-supply voltage in the predetermined position. The wiring position determination step determines a wiring position of the connection wiring for connecting the voltage detection cell and the voltage drop detection circuit for detecting the voltage drop of the power-supply voltage detected by the voltage detection cell. The integrated circuit production step produces an integrated circuit including the voltage detection cell and the connection wiring. The voltage drop detection step detects the voltage drop of the power-supply voltage detected by the voltage detection cell by means of the voltage drop detection circuit. The voltage drop correction step corrects the voltage drop of the power-supply voltage based on the voltage drop detected at the voltage drop detection step.

Further, the voltage drop correction step changes a clock frequency of the power-supply voltage based on the voltage drop detected at the voltage drop detection step so as to correct the voltage drop.

Further, the voltage drop correction step changes a voltage of the power-supply voltage based on the voltage drop detected at the voltage drop detection step so as to correct the voltage drop. As a result, low voltage and the high speed in the semiconductor integrated circuit are ensured, and the reliability can be heightened.

Other objects and features of this invention will become apparent from the following description with reference to the accompanying drawings.

BRIEF DESCRIPTION OF THE DRAWINGS

FIG. 5 is a diagram showing a detailed structure of the detection circuit of the semiconductor integrated device according to a second embodiment of the present invention.

FIG. 6 is a timing chart showing an operation of the detection circuit shown in FIG. 5.

DESCRIPTION OF THE PREFERRED EMBODIMENTS

Preferred embodiments of a semiconductor integrated device, methods of detecting and correcting the voltage drop according to the present invention will be explained below with reference to the attached drawings.

Figure 1:
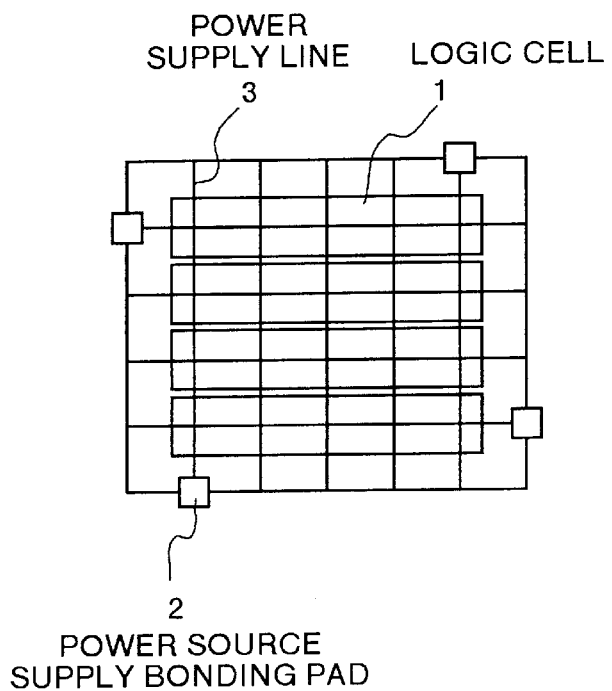
FIG. 1 is a diagram showing a schematic structure of a semiconductor device to be integrated according to a first embodiment of the present invention.

FIG. 1 is a schematic structure of a semiconductor device to be integrated which is applied to a semiconductor integrated device according to a first embodiment of the present invention. As shown in FIG. 1, a plurality of logic cells 1 are mounted on the semiconductor integrated device. Power-supply lines 3 for supplying a power supply to the respective logic cells 1 are wired on the semiconductor integrated device via power source supply bonding pads 2 in a mesh pattern.

The power-supply lines 3 supply a power supply to a plurality of transistors which are arranged so as to cover the logic cells 1 at the center portion of the semiconductor device to be integrated. For this reason, as for a power-supply voltage, a voltage drop occurs due to transistor load, wiring capacitance of the power-supply lines 3, resistance load or the like, and generally great voltage drop occurs in the vicinity of the center portion of the semiconductor integrated device.

Figure 2:
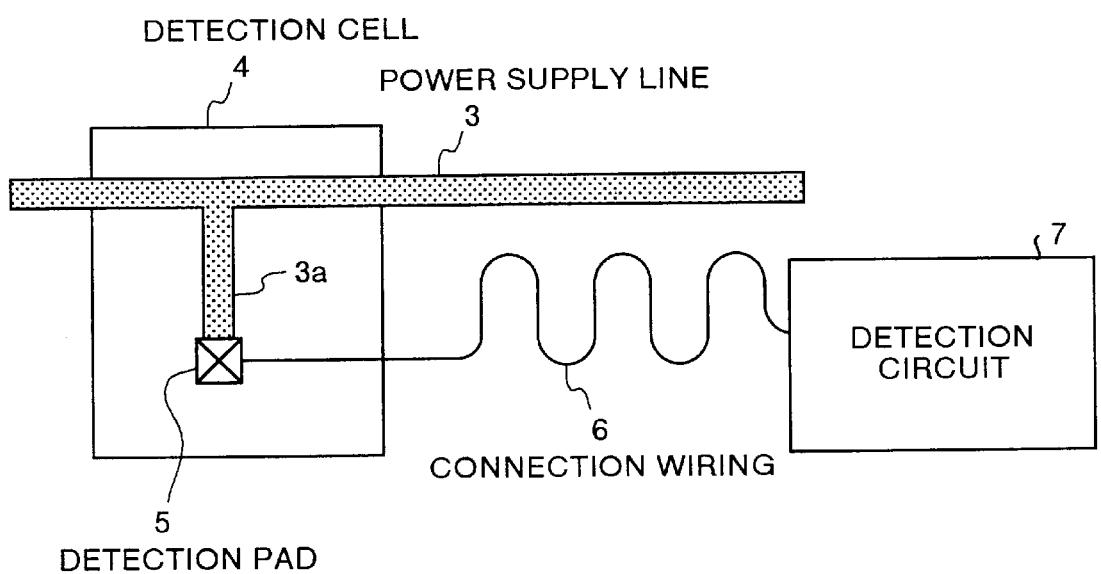
FIG. 2 is a diagram showing a connecting relationship between a detection cell, connection wiring and a detection circuit of the semiconductor integrated device according to the first embodiment of the present invention.

FIG. 2 is a diagram showing structures of a detection cell 4, connection wiring 6 and a detection circuit 7 which are arranged on the semiconductor device to be integrated shown in FIG. 1. The detection cell 4 for detecting a voltage of the power-supply lines 3 is provided in a predetermined position on the power-supply lines 3 in the semiconductor device to be integrated. The detection cell 4 forms a detection line 3a for detecting a power-supply voltage in the predetermined position on the power-supply lines 3, and the detection pad 5 is arranged at the point of the detection line 3a. The detection circuit 7 detects a voltage drop of the power-supply voltage detected by the detection cell 4. The detection cell 4 and the detection circuit 7 are connected by the connection wiring 6.

Figure 3:
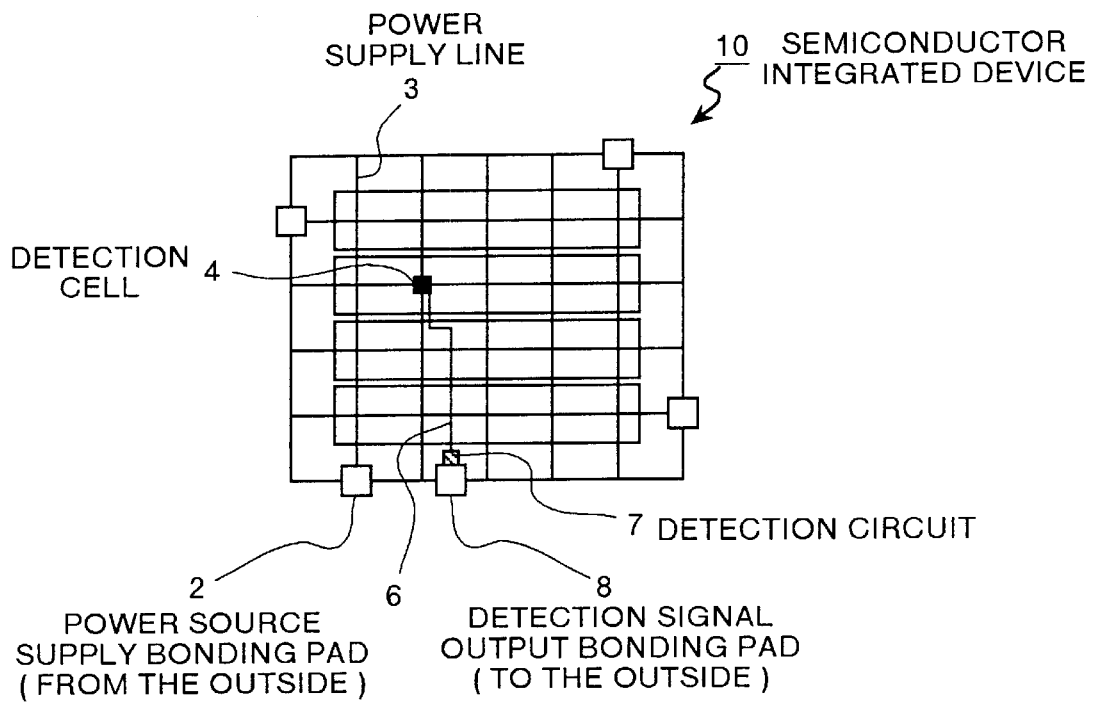
FIG. 3 is a diagram showing a structure of the semiconductor integrated device according to the first embodiment of the present invention.

FIG. 3 is a diagram showing a semiconductor integrated device according to the first embodiment of the present invention. The detection cell 4, the connection wiring 6, and the detection circuit 7 shown in FIG. 2 are arranged on the semiconductor device to be integrated shown in FIG. 1. In FIG. 3, the detection cell 4 is arranged on an arbitrary line of the power-supply lines 3 wired on a semiconductor integrated device 10. The detection circuit 7 is arranged in the vicinity of a detection signal output bonding pad 8 which outputs a detected result of the voltage drop to the outside. Moreover, the detection cell 4 and the detection circuit 7 are connected by the connection wiring 6. In the semiconductor integrated device 10 shown in FIG. 3, one detection cell 4 is arranged, but a plurality of detection cells 4 may be provided. A plurality of detection cells 4 are provided so as to be capable of detecting also scattering of the power-supply voltage in the semiconductor integrated device 10.

The predetermined position of the detection cell 4 is a position where it is considered that the voltage drop is the greatest, for example, a position which is the farthest (longest) from the power-supply bonding bad 2. This position may be the center of the semiconductor integrated device 10 or a position of the power-supply line such as a portion of a high-speed operating circuit such as a PLL circuit or a clock-operating circuit.

When the predetermined position of the detection cell 4 is the farthest from the power source supply bonding pad 2, length of the power-supply line 3 is measured so that the predetermined position can be obtained easily. Therefore, the length of the power-supply line 3 is measured when the circuit of the semiconductor integrated device 10 is designed so that the predetermined position of the detection cell 4 is determined. When the predetermined position of the detection cell 4 is determined, the wiring of the connection wiring 6 is determined. The arrangement of the detection cell 4 and the wiring of the connection wiring 6 can be realized easily by a software of an automatic arrangement/wiring.

The software for automatically calculating the arrangement/wiring calculates the power consumption. The detection cell 4 may be arranged on the center portion of the logic cells 1 where the power consumption is the largest. In another way, the detection cell 4 may be arranged on a boundary between a logic cell and the cell logic 1 where the power consumption is the largest. Further, in the case of an analog integrated circuit or a digital/analog hybrid integrated circuit, the detection cell 4 is arranged on an analog circuit where a voltage change greatly influences an output signal so that reliability of an analog signal is heightened.

In order to determine the predetermined position of the detection cell 4, the case that the arrangement is determined based on real wiring in the semiconductor integrated device 10, and the case that the arrangement is determined with reference to a circuit diagram before the real wiring are considered. In both the cases, the predetermined position can be determined. In the present invention, the arrangement position of the detection cell 4 (for example, a center a chip or a center of the logic cell) and the detection circuit 7 are determined. Thereafter, the connection wiring 6 is given priority in determination, and the step of producing the integrated circuit proceeds. In this case, when the arrangement position of the detection cell 4 is determined, a selection is made between a method of automatically arranging it by calculation as mentioned above and a method of arranging it on the center portion of the chip or on the center portion of the logic cell manually. Moreover, when the detection cell 4 is included in the circuit diagram before the real wiring, only the detection circuit 7 is given priority in arrangement, and the step of determining the arrangement of the detection cell 4 and the step of determining the wiring of the connection wiring 6 are executed in the step of producing the integrated circuit.

Figure 4:
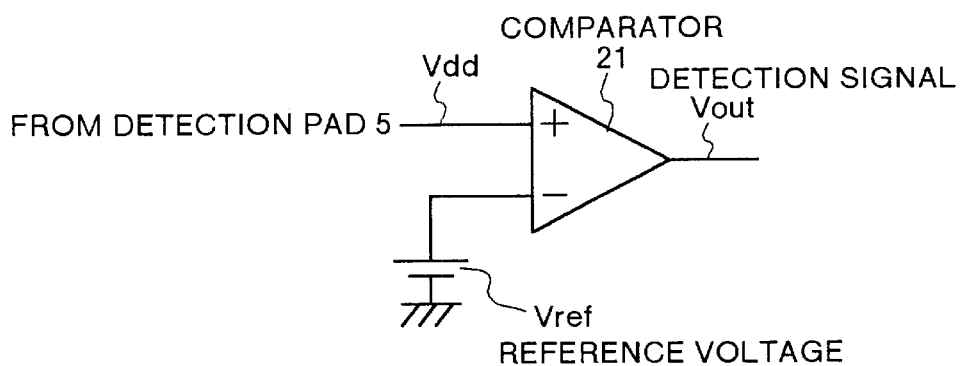
FIG. 4 is a diagram showing one example of a detailed structure of the detection circuit shown in FIG. 3.

FIG. 4 is a diagram showing a detailed structure of the detection circuit 7 shown in FIG. 3. This detection circuit 7 is provided with a comparator 21. A power-supply voltage Vdd which is output from the detection pad 5 is input into the plus terminal of the comparator 21. Further, a reference voltage Vref is input into the minus terminal of the comparator 21. When the power-supply voltage Vdd obtains a value which is not more than the reference voltage Vref, the comparator 21 outputs "L". When the power-supply voltage Vdd exceeds the reference voltage Vref, the comparator 21 outputs "H".

A detection signal Vout which is "H" (logic level high) or "L" (logic level low) is output from the comparator 21 to the outside via the detection signal output bonding pad 8. When the detection signal Vout is "H", a judgment is made based on the detection signal Vout output to the outside that the power-supply voltage Vdd is in the normal state, that is, the voltage drop is within an allowable range. When the detection signal Vout is "L", a judgment is made that the power-supply voltage Vdd is in the abnormal state, that is, the voltage drop exceeds the allowable range, and the power-supply voltage Vdd is recognized to be corrected.

In the above-explained first embodiment, the detection cell 4 is arranged in the predetermined position of the semiconductor integrated device 10, and the detection circuit 7 detects the voltage drop of the power-supply voltage based on the value of the power-supply voltage detected by the detection cell 4. As a result, even the semiconductor integrated device having high integration degree can recognize the voltage drop of the power-supply voltage easily.

A second embodiment of the present invention will now be explained. In the above- explained first embodiment, the comparator 21 of the detection circuit 7 is used so as to judge as to whether or not the voltage drop of the power-supply voltage is normal and output the judged result. However, in the second embodiment, a delay element 31 and a flip-flop circuit 32 are used so as to judge as to whether or not the voltage drop of the power-supply voltage is normal and output the judged result. The other configuration is the same as that in the first embodiment.

FIG. 5 is a diagram showing a detailed configuration of the detection circuit 7 of the semiconductor integrated device according to the second embodiment of the present invention. FIG. 6 shows a timing chart of signals of the respective sections shown in FIG. 5. As shown in FIG. 5, a reference signal Sa and a power-supply voltage Vdd detected by the detection cell 4 are input into the delay element 31. The delay element 31 outputs delay signals Sb and Sb', which are obtained by giving a delay amount in proportion to the power-supply voltage Vdd to the reference signal Sa, into the "D" terminal of the flip-flop circuit 32.

Meanwhile, a signal Sc which is the same as the reference signal Sa is input into the "T" terminal of the flip-flop circuit 32. The flip-flop circuit 32 outputs the delay signals Sb and Sb', which are at the "D" terminal just when the signal Sc to be input into the "T" terminal rises, as signals Sd and Sd' from a "Q" terminal.

Therefore, as shown in (b) and (c) in FIG. 6, in the case of the power-supply voltage Vdd where the voltage drop is small, the delay signal Sb has a small delay amount tb. In the case of the power-supply voltage Vdd where the voltage drop is large, the delay signal Sb' has a large delay amount tb'. In this case, since just when the signal Sc trails, the delay signal Sb becomes "H", and the delay signal Sb' becomes "L". For this reason, the flip-flop circuit 32 outputs "H" and "L" (see (d) and (e) in FIG. 6).

In the case where the signal from the "Q" terminal of the flip-flop circuit 32 is a signal Sd at "H", then a judgment is made that the power-supply voltage Vdd is in the normal state. That is, the voltage drop is within the allowable range. In the case where the signal is a signal Sd' at "L", then a judgment is made that the power-supply voltage Vdd is in the abnormal state. That is, the voltage drop exceeds the allowable range, and the power-supply voltage Vdd is recognized to be corrected.

A clock signal may be used as the reference signal Sa. In this case, the delay element 31 is not required. The clock signal which has been just input into the semiconductor integrated device 10 may be input into the "T" terminal of the flip-flop circuit 32. Further, a clock signal inside the semiconductor integrated device 10 may be input into the "D" terminal of the flip-flop circuit 32. This is because when the clock signal inside the semiconductor integrated device 10 is delayed, this can be regarded as similar to the case that the voltage drop occurs. In this case, the clock signal is possibly delayed by 1 or more periods, but the voltage drop of the power-supply voltage is large. For this reason, the flip-flop circuit 32 cannot recognize the clock signal, and thus it does not output "H". As a result, there arises no problem.

In the second embodiment, similarly to the first embodiment, the detection cell 4 is arranged in the predetermined position of the semiconductor integrated device 10, and the detection circuit 7 detects the voltage drop of the power-supply voltage based on the value of the power-supply voltage detected by the detection cell 4. Therefore, even if the semiconductor integrated device has a high integration degree it can recognize the voltage drop of the power-supply voltage easily.

A third embodiment of the present invention will now be explained. In the above-explained first and second embodiments, the voltage drop of the power-supply voltage is detected. However, in the third embodiment, the voltage drop is corrected based on the result of detecting the voltage drop so that the semiconductor integrated device 10 can maintain the normal operation.

Figure 7:
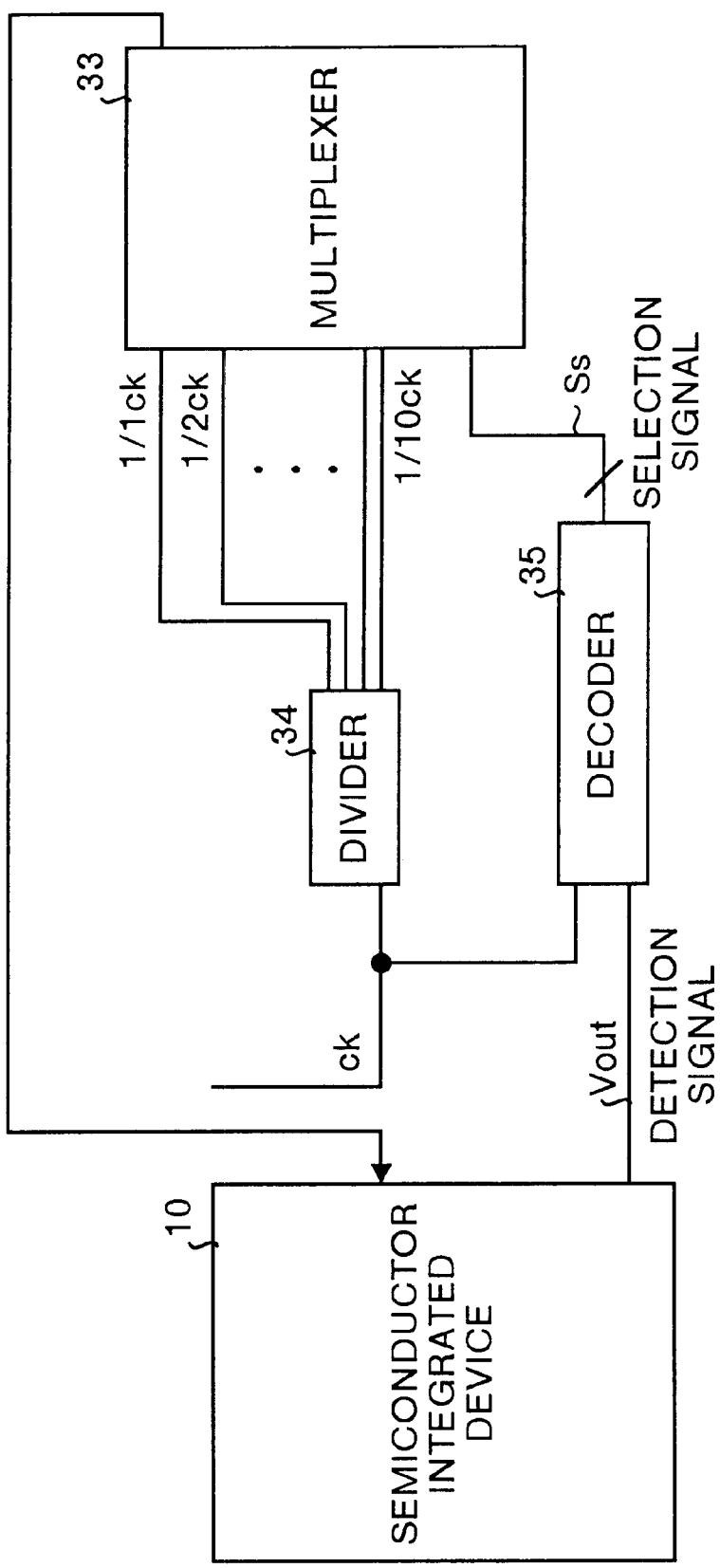
FIG. 7 is a diagram showing a structure of the semiconductor integrated device according to a third embodiment of the present invention.

FIG. 7 is a diagram showing a structure of the semiconductor integrated device according to the third embodiment of the present invention. In this semiconductor integrated device, the clock frequency is changed by using a detection signal Vout (Sd) output from the semiconductor integrated device 10 in order to cope with the voltage drop of the power-supply voltage.

That is, a divider 34 outputs a plurality of frequencies, which are obtained by dividing a clock signal CK, to a multiplexer 33. A decoder 35 is realized by a counter and uses the detection signal Vout as an enable signal of the counter. Namely, the decoder 35 counts up according to the clock signal CK as long as the detection signal Vout is "L", and outputs the values as a selection signal Ss to the multiplexer 33. When the value of the selection signal Ss is changed from "0" to "9", the multiplexer 33 outputs clock signals from a clock signal "1/1" CK with a "1/1" frequency of the clock frequency CK to a clock signal "1/n" CK with a "1/n" frequency of the clock frequency CK accordingly. Therefore, when the detection signal Vout is "L", that is, when the voltage drop occurs, the frequency of the clock signals output from the multiplexer 33 is controlled so that the frequency of the clock signal CK becomes low.

As a result, the frequency of the clock signal CK is lowered successively until the voltage drop of the power-supply voltage in the semiconductor integrated device 10 returns to the normal state. The reliability of the operation of the semiconductor integrated device 10 can be secured.

A fourth embodiment of the present invention will now be explained. In the above-explained third embodiment, unstable operation due to the voltage drop of the power-supply voltage is eliminated by changing the frequency of the clock signal CK. However, in the fourth embodiment, the power-supply voltage is controlled directly based on the detection signal Vout.

Figure 8:
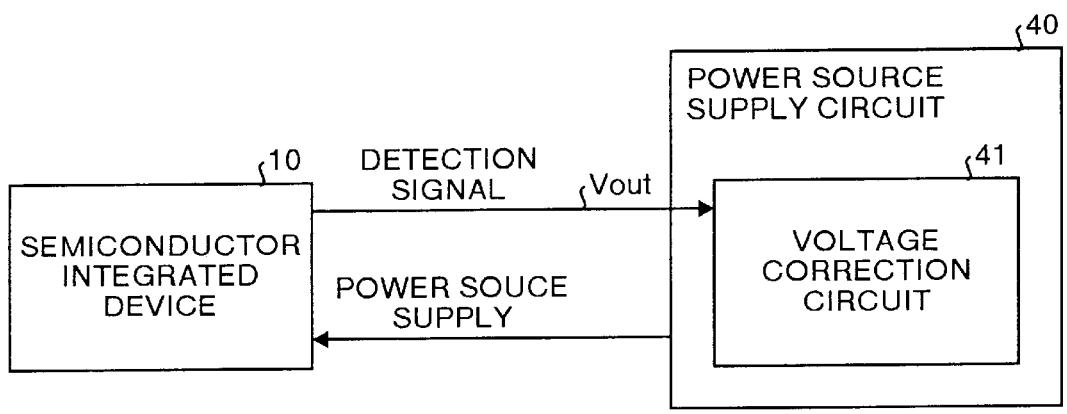
FIG. 8 is a diagram showing a structure of the semiconductor integrated device according to a fourth embodiment of the present invention.

FIG. 8 is a diagram showing a structure of the semiconductor integrated device according to the fourth embodiment of the present invention. This semiconductor integrated device has the semiconductor integrated device 10 and a power source supply circuit 40. The power source supply circuit 40 has a voltage correction circuit 41. The voltage correction circuit 41 controls a voltage of the power-supply voltage which is output to the semiconductor integrated device 10, using the detection signal Vout (Sd) output from the semiconductor integrated device 10.

Namely, when the detection signal Vout is "L", the voltage drop occurs. For this reason, the voltage correction circuit 41 controls the power-supply voltage to be supplied to the semiconductor integrated device 10 so that this voltage becomes higher than a current power-supply voltage. When the detection signal Vout is "H", the voltage drop is within the allowable range. For this reason, the voltage correction circuit 41 controls the power-supply voltage to be supplied to the semiconductor integrated device 10 so that this voltage is maintained. Here, the control range of the power-supply voltage falls within a range which is allowed by the semiconductor integrated device 10.

In the fourth embodiment, the high power-supply voltage is supplied until the voltage drop of the power-supply voltage in the semiconductor integrated device 10 is returned to the normal state. For this reason, the reliability of the operation of the semiconductor integrated device 10 can be secured.

According to the semiconductor integrated device of the invention, the voltage detection cell is arranged in the predetermined position on the power-supply wiring in the semiconductor integrated circuit and detects a power-supply voltage in the predetermined position. The power-supply voltage is output to the voltage drop detection circuit via the connection wiring, and the voltage drop detection circuit detects a voltage drop of the power-supply voltage detected by the voltage detection cell. Accordingly, voltage drop in the semiconductor integrated circuit can be confirmed simply and easily.

Further, the voltage drop detection circuit is composed of the comparator and compares the power-supply voltage detected by the voltage detection cell with a reference voltage. A judgment is made based on the compared result as to whether or not a voltage drop occurs. For this reason, the voltage drop can be confirmed easily by a simple structure.

Further, the delay element in the voltage drop detection circuit delays and output a predetermined input signal according to a voltage drop of the power-supply voltage detected by the voltage detection cell. The flip-flop circuit judges as to whether or not a voltage drop amount is not less than a predetermined value based on the predetermined input signal and the signal delayed and output by the delay element and outputs the judged result. As a result, the voltage drop can be confirmed easily by a simple structure.

Further, the voltage drop correction circuit corrects the voltage drop of the power-supply voltage based on the voltage drop which is detected by the voltage drop detection circuit. As a result, a low voltage and high speed in the semiconductor integrated circuit are ensured, and the reliability can be heightened.

Further, the voltage drop correction circuit is a frequency control circuit. The frequency control circuit changes a clock frequency of the power-supply voltage based on the voltage drop detected by the voltage drop detection circuit, and corrects the voltage drop. As a result, low voltage and high speed in the semiconductor integrated circuit are ensured, and the reliability can be heightened.

Further, the voltage drop correction circuit is a voltage control circuit. The voltage control circuit changes a voltage of the power-supply voltage based on the voltage drop detected by the voltage drop detection circuit, and corrects the voltage drop. As a result, low voltage and high speed in the semiconductor integrated circuit are ensured, and the reliability can be heightened.

According to the method of detection the voltage drop of this invention, the cell arrangement determination step determines a predetermined position of the voltage detection cell which is arranged in the predetermined position on the power-supply wiring in the semiconductor integrated circuit and detects a power-supply voltage in the predetermined position. The wiring position determination step determines a wiring position of the connection wiring for connecting the voltage detection cell and the voltage drop detection circuit for detecting the voltage drop of the power-supply voltage detected by the voltage detection cell. The integrated circuit producing step produces the integrated circuit including the voltage detection cell and the connection wiring. The voltage drop detection step detects the voltage drop of the power-supply voltage detected by the voltage detection cell using the voltage drop detection circuit. As a result, the voltage drop in the semiconductor integrated circuit can be confirmed simply and easily.

Further, the voltage drop detection step compares the voltage detected by the voltage detection cell with a reference voltage and detects the voltage drop of the power-supply voltage based on the compared result. As a result, the voltage drop in the semiconductor integrated circuit can be confirmed simply and easily.

Further, the voltage drop detection step detects a voltage drop of the power-supply voltage based on the delay amount according to the voltage detected by the voltage detection cell. As a result, the voltage drop in the semiconductor integrated circuit can be confirmed simply and easily.

According to the method of correction the voltage drop of this invention, the cell arrangement determination step determines a predetermined position of the voltage detection cell which is arranged in the predetermined position on the power-supply wiring in the semiconductor integrated circuit and detects the power-supply voltage in the predetermined position. The wiring position determination step determines a wiring position of the connection wiring for connecting the voltage detection cell and the voltage drop detection circuit for detecting the voltage drop of the power-supply voltage detected by the voltage detection cell. The integrated circuit production step produces an integrated circuit including the voltage detection cell and the connection wiring. The voltage drop detection step detects the voltage drop of the power-supply voltage detected by the voltage detection cell by means of the voltage drop detection circuit. The voltage drop correction step corrects the voltage drop of the power-supply voltage based on the voltage drop detected at the voltage drop detection step. As a result, low voltage and the high speed in the semiconductor integrated circuit can be ensured, and the reliability can be heightened.

Further, the voltage drop correction step changes a clock frequency of the power-supply voltage based on the voltage drop detected at the voltage drop detection step so as to correct the voltage drop. As a result, low voltage and the high speed in the semiconductor integrated circuit can be ensured, and the reliability can be heightened.

Further, the voltage drop correction step changes a voltage of the power-supply voltage based on the voltage drop detected at the voltage drop detection step so as to correct the voltage drop. As a result, low voltage and the high speed in the semiconductor integrated circuit are ensured, and the reliability can be heightened.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated device comprising:
   a voltage detection cell located at a position in power-supply wiring of a semiconductor integrated circuit and detecting a power-supply voltage at the position;
   a voltage drop detection circuit for detecting a voltage drop of the power-supply voltage detected by said voltage detection cell, said voltage drop detection circuit including:
      a delay element for delaying and outputting an input signal according to the voltage drop of the power-supply voltage detected by said voltage detection cell;
      a flip-flop circuit for determining whether the voltage drop is not less than a threshold voltage based on the input signal and a signal delayed and output by said delay element; and
   connection wiring connecting said voltage detection cell and said voltage drop detection circuit and outputting the power-supply voltage detected by said voltage detection cell to said voltage drop detection circuit.

2. The semiconductor integrated device according to claim 1, further comprising a voltage drop correction circuit for correcting the voltage drop of the power-supply voltage based on the voltage drop detected by said voltage drop detection circuit.

3. The semiconductor integrated device according to claim 2, wherein said voltage drop correction circuit is a frequency control circuit which changes a clock frequency based on the voltage drop detected by said voltage drop detection circuit to correct the voltage drop.

4. The semiconductor integrated device according to claim 2, wherein said voltage drop correction circuit is a voltage control circuit which changes a voltage of the power-supply voltage based on the voltage drop detected by said voltage drop detection circuit to correct the voltage drop.

5. A method of detecting a voltage drop in an integrated circuit, comprising:
   determining a location of a voltage detection cell in power-supply wiring of a semiconductor integrated circuit for detecting a power-supply voltage at the location;
   determining a wiring position of connection wiring connecting said voltage detection cell and a voltage drop detection circuit for detecting a voltage drop of the power-supply voltage detected by said voltage detection cell;
   producing the integrated circuit including said voltage detection cell and said connection wiring; and
   detecting the voltage drop of the power-supply voltage detected by said voltage detection cell, using said voltage drop detection circuit, based on a delay according to the voltage detected by said voltage detection cell.

6. The method of detecting the voltage drop in the integrated circuit according to claim 5, comprising correcting the voltage drop of the power-supply voltage based on the voltage drop detected.

7. The method of detecting the voltage drop in the integrated circuit according to claim 6, including changing a clock frequency based on the voltage drop detected to correct the voltage drop.

* * * * *

UNITED STATES PATENT AND TRADEMARK OFFICE
CERTIFICATE OF CORRECTION

PATENT NO. : 6,377,083 B1
DATED : April 23, 2002
INVENTOR(S) : Takabayashi et al.

It is certified that error appears in the above-identified patent and that said Letters Patent is hereby corrected as shown below:

<u>Title page,</u>
Item [73], Assignee add:
-- [73]   Assignee:  Mitsubishi Denki Kabushiki Kaisha, Tokyo (JP) --

Signed and Sealed this

Tenth Day of December, 2002

JAMES E. ROGAN
*Director of the United States Patent and Trademark Office*